US 6,649,475 B1

(12) United States Patent
Wen et al.

(10) Patent No.: US 6,649,475 B1
(45) Date of Patent: Nov. 18, 2003

(54) METHOD OF FORMING TWIN-SPACER GATE FLASH DEVICE AND THE STRUCTURE OF THE SAME

(75) Inventors: Wen-Ying Wen, Hsin-Chu (TW); Jyhlong Horng, Hsin-Chu (TW); Erik S. Jeng, Hsin-Chu (TW); Bai-Jun Kuo, Hsin-Chu (TW); Chih-Hsueh Hung, Hsin-Chu (TW)

(73) Assignee: Megawin Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 10/158,154

(22) Filed: May 31, 2002

(51) Int. Cl.[7] .......................................... H01L 21/8247
(52) U.S. Cl. ...................................... 438/267; 438/594
(58) Field of Search ............................... 438/257–267, 438/593–594

(56) References Cited

U.S. PATENT DOCUMENTS

| 5,397,723 | A | * | 3/1995 | Shirota et al. ............... 438/257 |
| 5,494,838 | A | | 2/1996 | Chang et al. |
| 5,915,177 | A | * | 6/1999 | Tseng ........................... 438/264 |
| 6,174,759 | B1 | | 1/2001 | Verhaar et al. |
| 6,191,980 | B1 | | 2/2001 | Kelley et al. |
| 6,228,695 | B1 | | 5/2001 | Hsieh et al. |
| 6,271,090 | B1 | * | 8/2001 | Huang et al. ................ 438/264 |
| 2002/0142543 | A1 | * | 10/2002 | Lin et al. ...................... 428/257 |

* cited by examiner

*Primary Examiner*—Richard Booth
(74) *Attorney, Agent, or Firm*—Rosenberg, Klein & Lee

(57) ABSTRACT

The structure of the FLASH device includes a first dielectric layer formed on a substrate. A floating gate with spacer profile formed on the first dielectric layer. A dielectric spacer is formed on the floating gate for isolation. A second dielectric layer is formed along the approximately vertical surface of the floating gate and the dielectric spacer and a lateral portion of the second dielectric layer laterally extends over the substrate adjacent the floating gate. A control gate is formed on the lateral portion of the second dielectric layer that laterally extends over the substrate. The control gate is formed on the lateral portion of the second dielectric layer.

19 Claims, 4 Drawing Sheets

METHOD OF FORMING TWIN-SPACER GATE FLASH DEVICE AND THE STRUCTURE OF THE SAME

The present invention relates to a semiconductor device, and more specifically, to a Flash device with twin-spacer floating gate and the structure of the same.

BACKGROUND OF THE INVENTION

The semiconductor industry has been advanced to the field of Ultra Large Scale Integrated (ULSI) technologies. The fabrication of the nonvolatile memories also follows the trend of the size reduction of a device. Thanks to their advantages, such as non-volatility, fast access time and low power dissipation, non-volatile memory can be applied as portable handy equipments, solid-state camera and PC cards. As known in the art, the nonvolatile memories are currently used in electronic devices to store structure data, program data and other data during repeated reading and writing operations. The field of the nonvolatile memories has recently focused on the electrically erasable programmable read only memory (EEPROM). The nonvolatile memories include various types of devices. One of the famous types is called EEPROM (electrically erasable programmable read only memory) Different types of devices have been developed for specific applications. These parts have been developed with a focus on the high endurance and high-speed requirements. EEPROM needs multi-layer of polysilicon and silicon dioxide, therefore, multi-masking are used during the fabrication, thereby increasing the time for manufacturing the devices. One of the present researches is focus on how to integrate the manufacture process to reduce the cost. One of the approaches is to integrate the memory process with the CMOS fabrication.

As known, a conventional EEPROM comprises a stacked gate including a floating gate used for storing charge, and a controlling gate which is used for controlling data storage. The floating gate is located between the control gate and the substrate without connecting to any bias line. The control gate connects to a word line. A source region and a drain region are coupled to a bit line. Memory arrays comprise a plurality of cells arranged on rows and columns, and each memory cell is identified by an own address and biases are coupled to the row and the column of the cell, so that the cell can be read and written. In general, the rows are known as word lines, and the columns are known as bit lines. Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, prior art techniques have been utilized to form a line of continuously running implanted source material within the semiconductor substrate and running parallel with the floating gate word lines. In a principal technique of achieving the same, the substrate has first been fabricated to form field oxide regions by LOCOS. The fabrication forms alternating strips of active area and LOCOS field oxide running substantially perpendicular to the floating gate word lines that will be subsequently formed. Thus running immediately adjacent and parallel with the respective word lines will be an alternating series of LOCOS isolation regions and active area regions on both the source and drain sides of a respective line of floating gates.

A prior art that relates to the field is disclosed in the U.S. Pat. No. 6,174,759 to Verhaar, entitled "Method of manufacturing a semiconductor device". The assignee is U.S. Philips Corporation (New York, N.Y.) and filed the prior art on May 3, 1999. The method disclosed a process that can integrate with the CMOS process. Lucent Technologies, Inc. disclosed a single poly EEPROM on May 31, 2000 in U.S. Pat. No. 6,191,980. The device includes control device and erase device, all of which share a common polysilicon floating gate which is designed to retain charge in the programmed memory cell.

Taiwan Semiconductor Manufacturing Company disclosed a FLASH having spacer floating gate adjacent to the control gate in U.S. Pat. No. 6,228,695, entitled "Method to fabricate split-gate with self-aligned source and self-aligned floating gate to control gate", filed on May 27, 1999. A split-gate FLASH memory cell having self-aligned source and floating gate self-aligned to control gate is disclosed as well as a method of forming the same. This is accomplished by depositing over a gate oxide layer on a silicon substrate a poly-1 layer to form a vertical control gate followed by depositing a poly-2 layer to form a spacer floating gate adjacent to the control gate with an intervening intergate oxide layer. The source is self-aligned and the floating gate is also formed to be self-aligned to the control gate, thus making it possible to reduce the cell size. The resulting self-aligned source alleviates punch-through from source to control gate while the self-aligned floating gate with respect to the control gate provides improved programmability. The method also replaces the conventional poly oxidation process thereby yielding improved sharp peak of floating gate for improved erasing and writing of the split-gate FLASH memory cell.

Motorola, Inc. disclosed a FLASH device with spacer floating gate. Please turn to U.S. Pat. No. 5,494,838, entitled "Process of making EEPROM memory device having a sidewall spacer floating gate electrode". The article is filed on Feb. 27, 1996.

SUMMARY OF THE INVENTION

The object of the present invention is to disclose a nonvolatile memory with twin-spacer, wherein the twin spacer includes a conductive spacer floating gate and a conductive spacer control gate.

The further object of the present invention is to disclose a nonvolatile memory with a self-aligned control gate.

The steps of the present invention include forming the LOCOS for isolation. A pad oxide and a nitride layer are formed on the substrate. Subsequently, the nitride layer is next pattern on the substrate by using conventional lithography procedure. Successively, a polysilicon layer is formed along the surface of the nitride masking. The next step is to perform an anisotropically etch for etching the polysilicon layer, thereby forming conductive spacer lying on the sidewall of the opening of the nitride masking as the floating gate. A portion of the oxide layer is also removed to expose the substrate.

TEOS-oxide spacer is then formed on the conductive spacer by using conventional deposition and anisotropical etching. After the TEOS-oxide spacer is formed, a blanket ion implantation with n type conductive dopants such as arsenic and phosphorus are respectively doped into the substrate using the TEOS-oxide spacer as masking. Therefore, the n type highly doped source region is formed adjacent to the floating gate structures.

A further TEOS-oxide layer is formed on the nitride masking and the TEOS-oxide spacer, followed by etching the TEOS-oxide layer to remain the residual oxide on the top of the TEOS-oxide spacer. Next, the nitride masking and the pad oxide 6 are removed. In a preferred embodiment, the silicon nitride material may be removed by the using a heated solution of phosphorus acid. The silicon oxide layer may be removed by HF solution or BOE (buffer oxide etching) solution. A gate dielectric layer is then formed on the substrate after the removal of the nitride masking and pad oxide.

A dielectric layer is formed along the surface of the floating gates as a tunneling dielectric layer (or called inter-gate dielectric layer). Preferably, the tunneling dielectric may be composed by oxide, nitride, silicon oxynitride, ON (oxide/nitride) or ONO (oxide/nitride/oxide). A further conductive layer is formed on the tunneling dielectric layer as a control gate. Finally, an etching process is introduced to define the control gate and the control gate is self-aligned to the floating gate without the alignments procedure.

The structure of the FLASH device includes a first dielectric layer formed on a substrate. A floating gate with spacer profile formed on the first dielectric layer. A dielectric spacer is formed on the floating gate for isolation. A second dielectric layer is formed along the approximately vertical surface of the floating gate and the dielectric spacer and a lateral portion of the second dielectric layer laterally extends over the substrate adjacent the floating gate. A control gate is formed on the lateral portion of the second dielectric layer that laterally extends over the substrate. The control gate is formed on the lateral portion of the second dielectric layer.

BRIEF DESCRIPTION OF THE DRAWINGS

The foregoing. aspects and many of the attendant advantages of this invention will become more readily appreciated as the same becomes better understood by reference to the following detailed descriptions, when taken in conjunction with the accompanying drawings, wherein.

DETAILED DESCRIPTION OF THE PREFERRED EMBODIMENT

Figure 1:
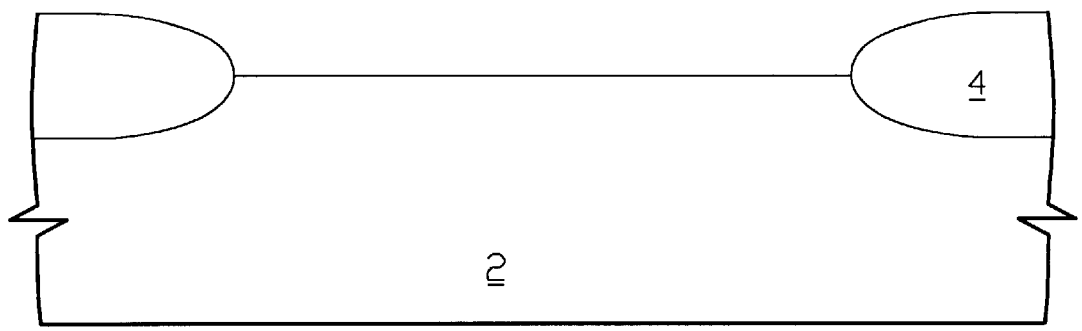
FIG. 1 is a cross sectional view of a substrate illustrating the step of forming field oxide according to the present invention.

The present invention proposes a novel method to fabricate the FLASH device and the structure of the same. The aspect of the present invention includes that the device has a spacer floating gate and the control gate is also shaped with the spacer profile. Further, the control gate will be self-aligned on the floating gate during formation. The detail description of the method will be seen as follows. Turning to FIG. 1, it shows the cross sectional view according to the present invention. The first procedure of the present invention is to form the LOCOS for isolation.

The steps for forming the LOCOS are illustrated as follows. A substrate 2 for forming the semiconductor device according to the present invention suitably includes a single crystal wafer 2 with a <100> or <111> crystallographic orientation. Other substrate material may be used. In a preferred embodiment, a silicon dioxide layer (not shown) is formed to a thickness of about 150 to 400 angstroms. However, the silicon dioxide layer is suitably formed using thermal oxidation. The temperature for this process may be about higher than 900 centigrade degrees. Alternatively, the silicon oxide layer can also be formed using a chemical vapor deposition (CVD) process, with a tetramethyl orthosilicate (TEOS) source, at a temperature between about 600 to 800° C. and a pressure between about 0.1 to 10 torr. Further, the silicon oxide layer also acts as a cushion between the silicon substrate 2 and a subsequent silicon nitride layer for reducing stress during subsequent oxidation for forming isolation.

Subsequently, a silicon nitride layer (not shown) is formed on the silicon dioxide to a thickness of about 500 to 1000 angstroms. After the silicon nitride layer is formed, a photoresist is patterned on the silicon nitride layer to define active areas. The silicon nitride layer and the oxide are etched using the photoresist as an etching mask. Any suitable process can deposit the silicon nitride layer. For example, low pressure chemical vapor deposition (LPCVD), plasma enhanced chemical vapor deposition (PECVD), or high density plasma chemical vapor deposition (HDPCVD) may be used. In the preferred embodiment, the reaction gases used to form silicon nitride layer 6 are $SiH_4$, $NH_3$, $N_2$, $N_2O$ or $SiH_2Cl_2$, $NH_3$, $N_2$, $N_2O$. In the preferred embodiment, the silicon nitride layer is etched using $CF_4$ plasma as the etchant. The photoresist is then removed. Then, a thermal oxidation process is performed using the silicon nitride layer as a mask at a temperature between about 1000 to 1100° C. to form isolation 4 in the substrate 2. Therefore, the conventional LOCOS structure is formed for isolation. Then, the nitride and oxide are both removed.

Figure 2:
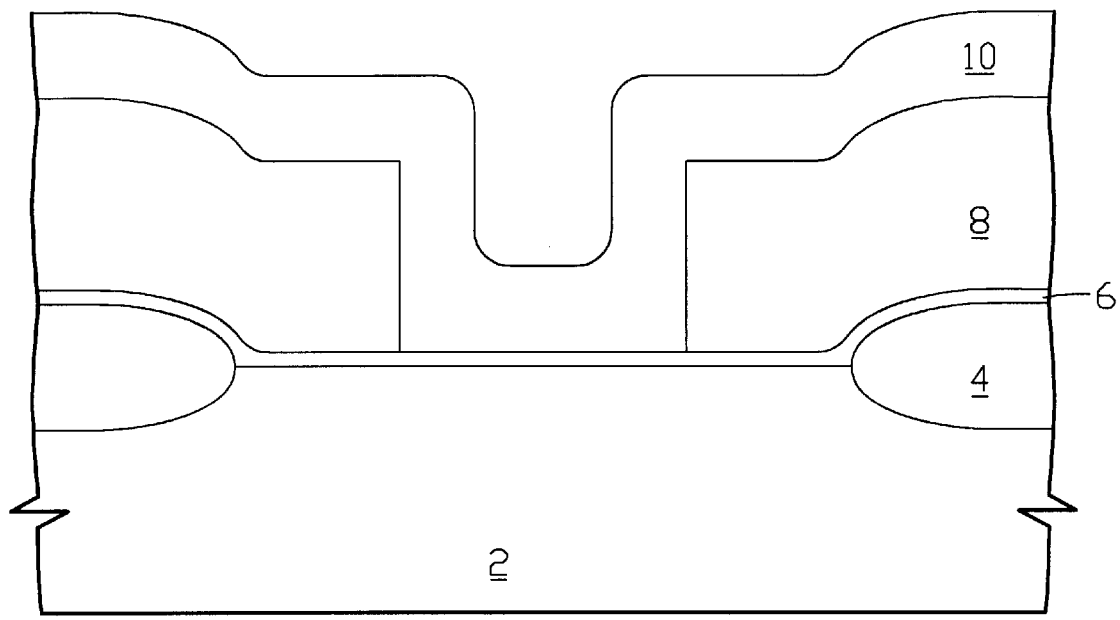
FIG. 2 is a cross sectional view of a substrate illustrating the step of forming nitride pattern according to the present invention.
Figure 3:
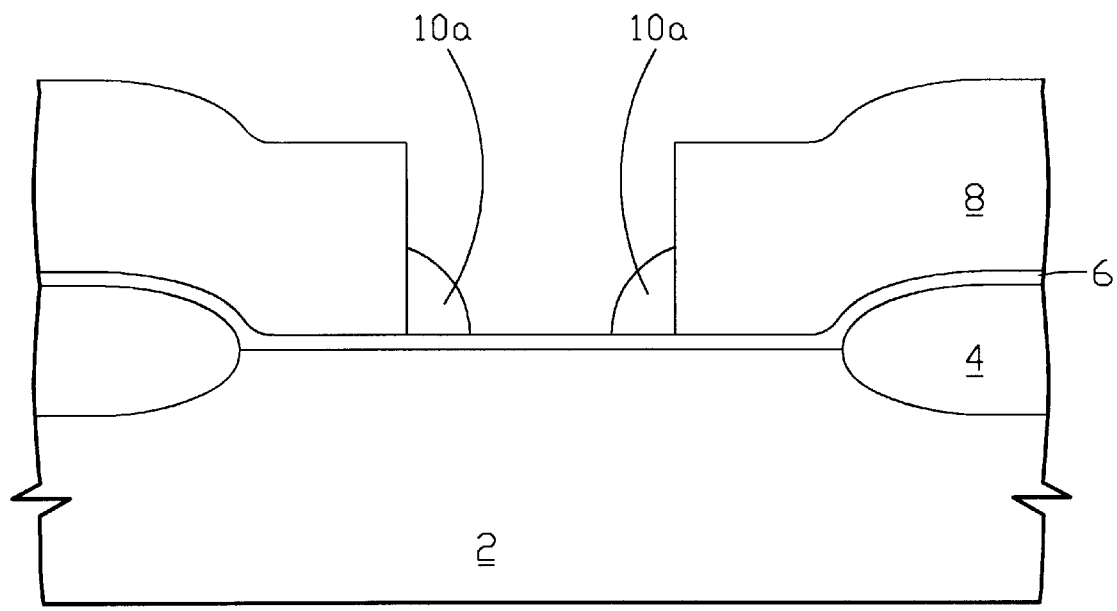
FIG. 3 is a cross sectional view of a substrate illustrating the step of forming the polysilicon spacer according to the present invention.

Turning to FIG. 2, a further pad oxide 6 and the nitride layer 8 are respectively formed on the substrate 2. Subsequently, the nitride masking 8 is next pattern on the substrate 2 by using conventional lithography procedure. The method for forming the nitride 8 and oxide 6 are illustrated as previously mentioned procedure. Successively, a polysilicon layer 10 is formed along the surface of the nitride masking 8. The next step is performed to anisotropically etch the polysilicon layer 10, thereby forming conductive spacer 10a lying on the sidewall of the opening of the nitride masking 8 as the floating gate. Preferably, the conductive spacers 10 are formed of doped polysilicon layer or in-situ doped polysilicon. A portion of the oxide layer 6 is also removed to expose the substrate 2, a shown in FIG. 3.

Figure 4:
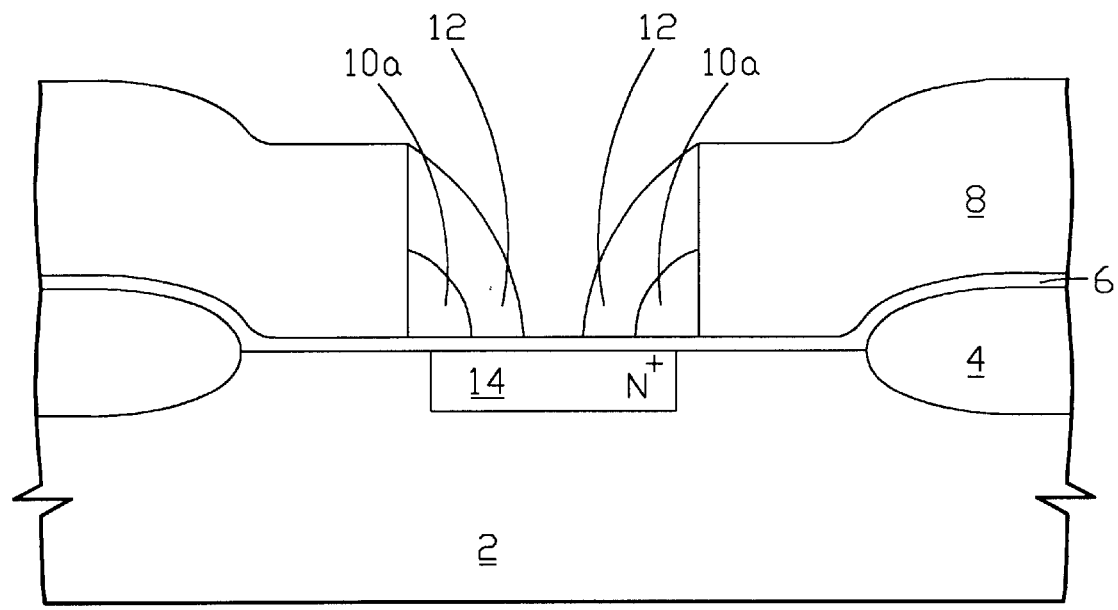
FIG. 4 is a cross sectional view of a substrate illustrating the step of forming N+doped region according to the present invention.

Referring to FIG. 4, a TEOS-oxide spacer 12 is formed on the conductive spacer 10a by using conventional deposition and anisotropical etching. The oxide for forming the oxide spacer 12 may be formed using other known oxide chemical compositions and procedures. For example, the TEOS-oxide layer can be silicon dioxide formed using a chemical vapor deposition process, with a tetramethyl orthosilicate (TEOS) source, at a temperature between about 600 to 800 degrees centigrade and a pressure of about 0.1 to 10 torr. The TEOS-oxide spacer 12 is utilized to limit the doped-ion regions. In another case, the dielectric spacer 12 may be omitted and the procedure for forming the structure is optional.

After the TEOS-oxide spacer 12 is formed. A blanket ion implantation with n type conductive dopants such as arsenic and phosphorus are respectively doped into the substrate 2 using the TEOS-oxide spacer 12 as masking. Therefore, the n type highly doped source region 14 is formed adjacent to the floating gate structures 10a. The energy and dosage of the arsenic implantation are about 50 to 70 KeV, 4E16 to 6E16 atoms/cm$^2$, respectively. Further, The energy and dosage of the phosphorus implantation are about 40 to 60 KeV, 2E15 to 4E15 atoms/cm$^2$.

Figure 5:
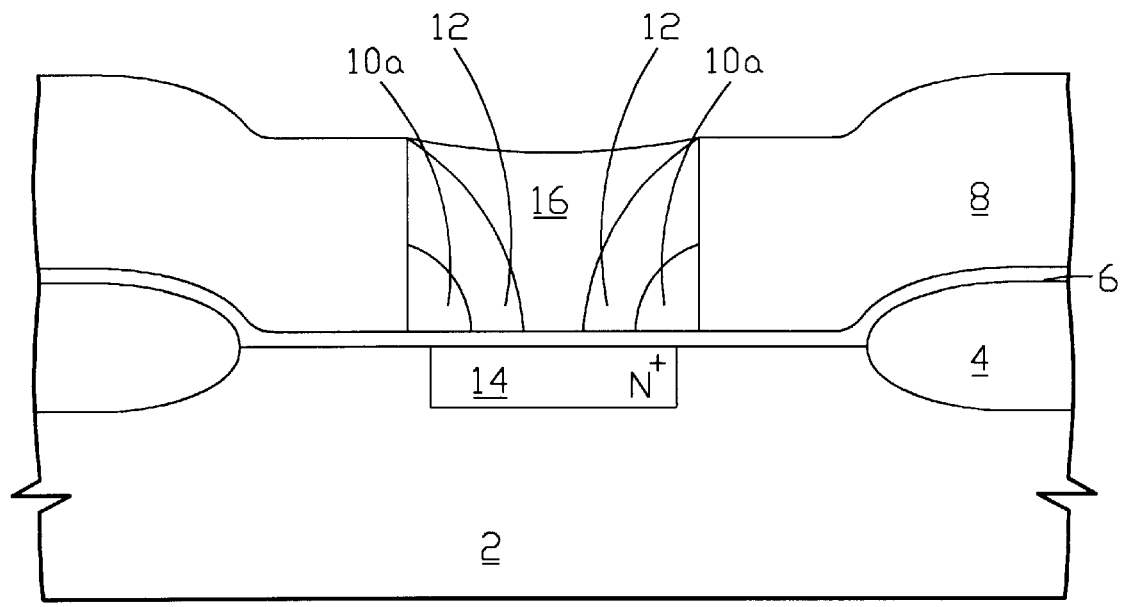
FIG. 5 is a cross sectional view of a substrate illustrating the step of forming oxide layer according to the present invention.
Figure 6:
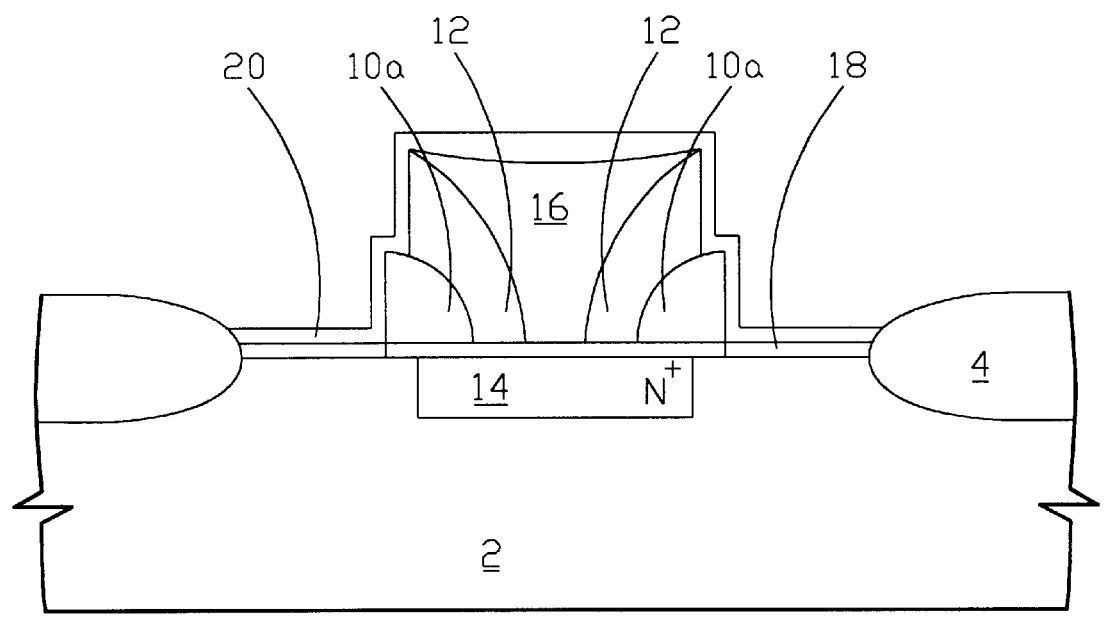
FIG. 6 is a cross sectional view of a substrate illustrating the step of removing the nitride layer according to the present invention.

Please see FIG. 5, a further TEOS-oxide layer 16 is formed on the nitride masking 8 and the TEOS-oxide spacer 12, followed by etching the TEOS-oxide layer 16 to remain the residual oxide on the top of the TEOS-oxide spacer 12. If the dielectric spacer 12 is omitted, then the oxide plug formed by the TEOS-oxide layer 16 will be located on the floating gate 10. Next, the nitride masking 8 and the pad oxide 6 is removed as shown in FIG. 6. In a preferred embodiment, the silicon nitride material may be removed by the using a heated solution of phosphorus acid. The silicon oxide layer 4 may be removed by HF solution or BOE (buffer oxide etching) solution. Please turn to FIG. 6, a gate dielectric layer 18 is then formed on the substrate 2 after the removal of the nitride masking 8 and pad oxide 6. This step can be omitted, namely, is optional.

Figure 7:
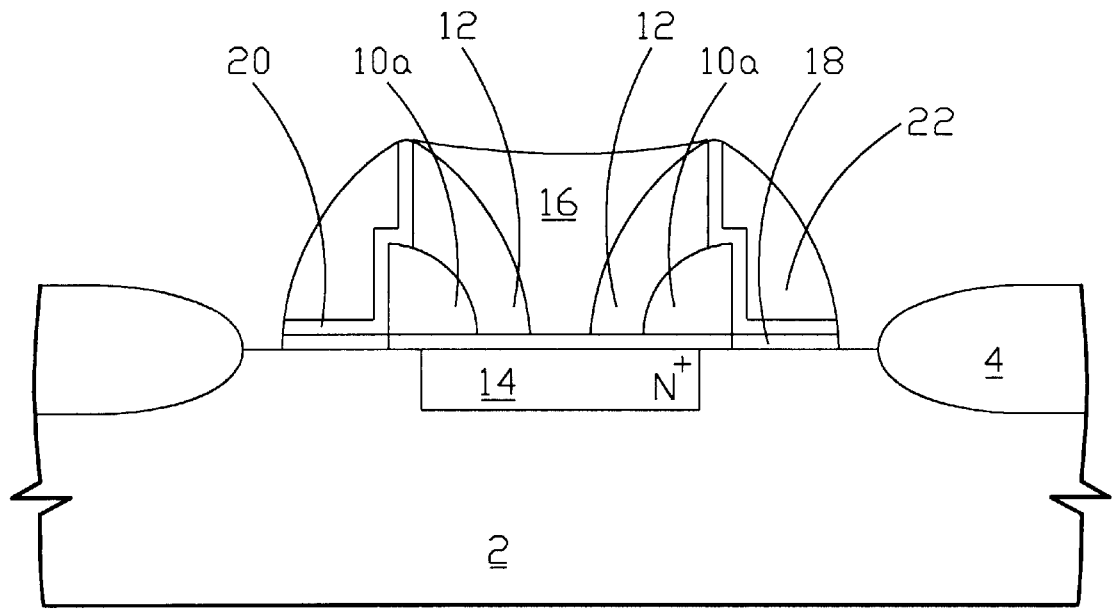
FIG. 7 is a cross sectional view of a substrate illustrating. the step forming control gate according to the present invention.

As shown in FIG. 6, a dielectric layer 20 is formed along the surface of the floating gates as a tunneling dielectric layer (or called inter-gate dielectric layer). Preferably, the tunneling dielectric may be composed by oxide, nitride, silicon oxynitride, ON (oxide/nitride) or ONO (oxide/nitride/oxide). A further conductive layer 22, such as doped polysilicon layer, is formed on the tunneling dielectric layer 20 as a control gate. Finally, turning to FIG. 7, etching processes is introduced to define the control gate 16. It should be noted that the control gate is self-aligned on the floating gate without the masking and alignments procedure.

Figure 8:
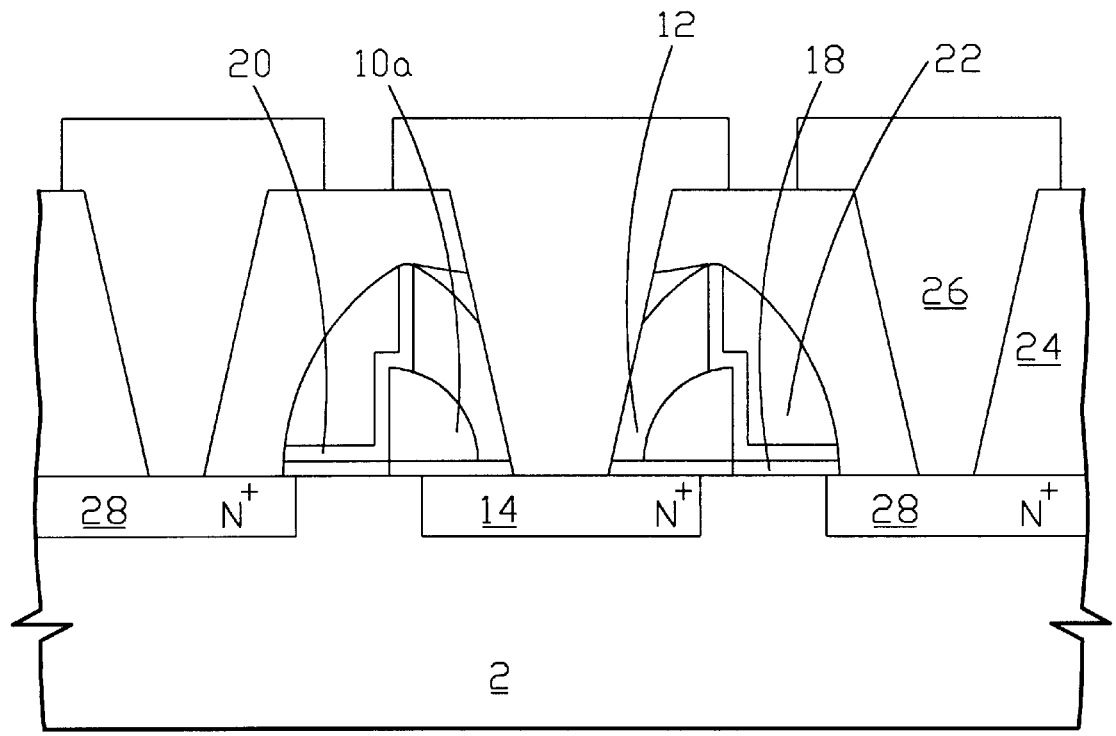
FIG. 8 is a cross sectional view of a substrate illustrating the step of forming interconnection according to the present invention.

The next procedures are to form the interconnection and doped regions. These steps may be achieved by various methods. One of the methods will be introduced as an example rather than limiting to the present invention. Turning to FIG. 8, an isolation layer 24 is formed on the cell structure for isolation. A contact hole is formed in the isolation layer 24 and the memory cell is separated by the etching for forming via hole. Then, doped region 28 is formed by ion implantation through the contact hole into the substrate 2. Conductive plugs 26 are subsequently formed in the isolation layer 24 by using the conventional manner.

The structure of the FLASH device includes a first dielectric layer 6 formed on a substrate 2. A floating gate 10a with spacer profile formed on the first dielectric layer 6. A dielectric spacer 12 is formed on the floating gate for isolation. A second dielectric layer 20 is formed along the approximately vertical surface of the floating gate 10a and the dielectric spacer 12 and a lateral portion of the second dielectric layer 20 laterally extends over the substrate adjacent the floating gate 10a. A control gate 22 is formed on the lateral portion of the second dielectric layer 20 that laterally extends over the substrate and the control gate 22 is attached on the second dielectric layer 20.

Some parameters of the preferred embodiment for the present invention are illustrated in Table 1 and Table 2 as follows. As will be understood by persons skilled in the art, the foregoing parameters of the present invention is illustrative of the present invention rather than limiting the present invention.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

TABLE 1

FLASH memory device parameters

| | |
|---|---|
| p-substrate | 8~12 Ω-cm |
| tunnel oxide thickness | 70~100A |
| floating gate thickness | 1500A |
| ONO thickness | 250~500A |
| control gate thickness | ~5000A |
| source/drain implant | As75, 50~70 Kev, 5E15, tilt 0 deg |
| | P31, 40~60 Kev, 3E15, tilt 0 deg |

TABLE 2

FLASH memory cell operation conditions

| MODE bias conditions | programming | | erasing | reading |
|---|---|---|---|---|
| control gate (word line) | 8 V | 4 V | 3 V | 10~12 V | 2 V |
| source | 4 V | 8 V | 6 V | 0 V | 4 V |
| Drain (bit line) | | 0.8 SV | | 0 V | 0 V |

What is claimed is:

1. A method for forming a FLASH device comprising:

forming a pad oxide layer on a substrate;

forming a first dielectric layer on said pad oxide layer;

patterning said first dielectric layer;

forming a first conductive layer over said patterned first dielectric layer;

etching said first conductive layer to form a conductive spacer on sidewalls of said patterned first dielectric layer to act as a floating gate;

forming a dielectric spacer over said floating gate;

performing an ion implantation to form a first doped region in said substrate using said dielectric spacer as a masking;

forming a second dielectric layer on said first dielectric layer and said dielectric spacer;

etching said second dielectric layer to remain a residual portion on said dielectric spacer;

removing said first dielectric layer and said pad oxide layer;

forming an inter-gate dielectric layer over said substrate, said floating gate and said dielectric spacer;

forming a second conductive layer on said inter-gate dielectric layer; and etching said second conductive layer to form a control gate, wherein said control gate is self-aligned to said floating gate, thereby forming a cell unit.

2. The method of claim 1, further comprising the following steps after forming said control gate:

forming an isolation layer on said cell unit;

forming via holes in said isolation layer;

forming a second doped region in said substrate via said via hole; and forming conductive plugs in said via holes.

3. The method of claim 1, wherein said first dielectric layer includes nitride.

4. The method of claim 3, wherein said first dielectric layer is removed by heated solution of phosphorus acid.

5. The method of claim 1, wherein said pad oxide is removed by HF solution or buffer oxide etching solution.

6. The method of claim 1, wherein said first conductive layer comprises polysilicon.

7. The method of claim 1, wherein said second conductive layer comprises polysilicon.

8. The method of claim 1, wherein said second dielectric layer comprises TEOS-oxide.

9. The method of claim 1, wherein said dielectric spacer comprises TEOS-oxide.

10. The method of claim 1, wherein said inter-gate dielectric layer includes ONO or NO.

11. A method for forming a FLASH device comprising:

forming a pad oxide layer on a substrate;

forming a first dielectric layer on said pad oxide layer;

patterning said first dielectric layer;

forming a first conductive layer over said patterned first dielectric layer;

etching said first conductive layer to form a conductive spacer on sidewalls of said patterned first dielectric layer to act as a floating gate;

performing an ion implantation to form a first doped region in said substrate;

forming a second dielectric layer on said first dielectric layer and said floating gate;

etching said second dielectric layer to remain a residual portion on said floating gate;

removing said first dielectric layer and said pad oxide layer;

forming an inter-gate dielectric layer over said substrate, said floating gate;

forming a second conductive layer on said inter-gate dielectric layer; and etching said second conductive layer to form a control gate, wherein said control gate is self-aligned to said floating gate, thereby forming a cell unit.

12. The method of claim 11, further comprising the following steps after forming said control gate:

forming an isolation layer on said cell unit;

forming via holes in said isolation layer;

forming a second doped region in said substrate via said via hole; and forming conductive plugs in said via holes.

13. The method of claim 11, wherein said first dielectric layer includes nitride.

14. The method of claim 13, wherein said first dielectric layer is removed by heated solution of phosphorus acid.

15. The method of claim 11, wherein said pad oxide is removed by HF solution or buffer oxide etching solution.

16. The method of claim 11, wherein said first conductive layer comprises polysilicon.

17. The method of claim 11, wherein said second conductive layer comprises polysilicon.

18. The method of claim 11, wherein said second dielectric layer comprises TEOS-oxide.

19. The method of claim 11, wherein said inter-gate dielectric layer includes ONO or NO.

* * * * *